United States Patent
Xu

(10) Patent No.: US 12,033,999 B2
(45) Date of Patent: Jul. 9, 2024

(54) ELECTROSTATIC DISCHARGE PROTECTION DEVICE

(71) Applicant: CHANGXIN MEMORY TECHNOLOGIES, INC., Hefei (CN)

(72) Inventor: Qian Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 462 days.

(21) Appl. No.: 17/472,057

(22) Filed: Sep. 10, 2021

(65) Prior Publication Data

US 2022/0028853 A1 Jan. 27, 2022

Related U.S. Application Data

(63) Continuation of application No. PCT/CN2021/103534, filed on Jun. 30, 2021.

(30) Foreign Application Priority Data

Jul. 23, 2020 (CN) .......................... 202010717110.5

(51) Int. Cl.
H01L 27/02 (2006.01)
(52) U.S. Cl.
CPC ................. H01L 27/0262 (2013.01)
(58) Field of Classification Search
None
See application file for complete search history.

(56) References Cited

U.S. PATENT DOCUMENTS

| 5,530,612 | A | 6/1996 | Maloney |
| 7,589,944 | B2 | 9/2009 | Mergens |
| 7,859,803 | B2 | 12/2010 | Ma |
| 10,008,491 | B1* | 6/2018 | Li ........................... H01L 23/66 |
| 2005/0057866 | A1 | 3/2005 | Mergens |
| 2007/0070563 | A1 | 3/2007 | Ma |
| 2011/0309409 | A1 | 12/2011 | Yamazaki |
| 2015/0060939 | A1* | 3/2015 | Di Sarro ............... H01L 29/861 |
| | | | 257/140 |
| 2015/0236011 | A1* | 8/2015 | Wang ...................... H01L 29/87 |
| | | | 257/173 |
| 2018/0033784 | A1* | 2/2018 | Appaswamy ....... H01L 27/0262 |
| 2019/0051646 | A1* | 2/2019 | Salcedo ............. H01L 27/0262 |
| 2020/0083212 | A1* | 3/2020 | Zhao ................. H01L 29/41716 |

(Continued)

FOREIGN PATENT DOCUMENTS

| CN | 1145143 A | 3/1997 |
| CN | 101019292 A | 8/2007 |
| CN | 102290414 A | 12/2011 |

(Continued)

*Primary Examiner* — Bilkis Jahan
(74) *Attorney, Agent, or Firm* — Kilpatrick Townsend & Stockton LLP

(57) ABSTRACT

Provided is an electrostatic discharge protection device, including: a darlington structure formed in a substrate, and a diode string formed in the substrate and including a plurality of diodes connected in series. A first end of the darlington structure is connected to a first voltage, and a second end of the darlington structure is connected to a second voltage. An anode of the diode string is connected to a third end of the darlington structure. A cathode of the diode string is connected to the second voltage.

7 Claims, 3 Drawing Sheets

(56) References Cited

U.S. PATENT DOCUMENTS

2020/0091138 A1    3/2020   Jiangnan
2021/0280699 A1*   9/2021   Nath ....................... H01L 29/04

FOREIGN PATENT DOCUMENTS

| CN | 102315258 A | 1/2012 |
|----|-------------|--------|
| CN | 103165600 A | 6/2013 |
| CN | 108695316 A | 10/2018 |
| CN | 108389891 B | 3/2019 |
| CN | 210430919 U | 4/2020 |

* cited by examiner

ELECTROSTATIC DISCHARGE PROTECTION DEVICE

CROSS-REFERENCE TO RELATED APPLICATIONS

This is a continuation application of International Patent Application No. PCT/CN2021/103534, filed on Jun. 30, 2021, which claims priority to China Patent Application No. 202010717110.5, filed on Jul. 23, 2020 in China Patent Office and entitled "ELECTROSTATIC DISCHARGE PROTECTION DEVICE", which are hereby incorporated by reference in their entirety.

BACKGROUND

As a manufacturing process of modern semiconductor devices becomes more advanced, channels are shorter, a junction depth becomes shallower, and an oxide layer becomes thinner. The application of silicide and the application of lightly doped drain (LDD) make a design window of an electrostatic discharge protection device smaller, and challenges that the electrostatic discharge protection device faces have become greater.

SUMMARY

The disclosure relates to the field of semiconductors, and in particular, to an electrostatic discharge protection device.

The disclosure provides an electrostatic discharge protection device, including: a darlington structure formed in a substrate, a first end of the darlington structure being connected to a first voltage, and a second end of the darlington structure being connected to a second voltage; and a diode string formed in the substrate and including a plurality of diodes connected in series. An anode of the diode string is connected to a third end of the darlington structure, and a cathode of the diode string is connected to the second voltage.

Details of all the embodiments of the disclosure will be described in the following accompanying drawings and descriptions. Other features, problems to be solved and beneficial effects of the disclosure will be easily understood by those skilled in the art according to the specification, the accompanying drawings and claims.

BRIEF DESCRIPTION OF THE DRAWINGS

For a better description and illustration of the embodiments of the present application, reference may be made to one or more of the drawings, but the additional details or examples used to describe the drawings should not be construed as limiting the scope of any one of the inventions, currently described embodiments, or preferred implementations of the present application.

DETAILED DESCRIPTION

Figure 1:
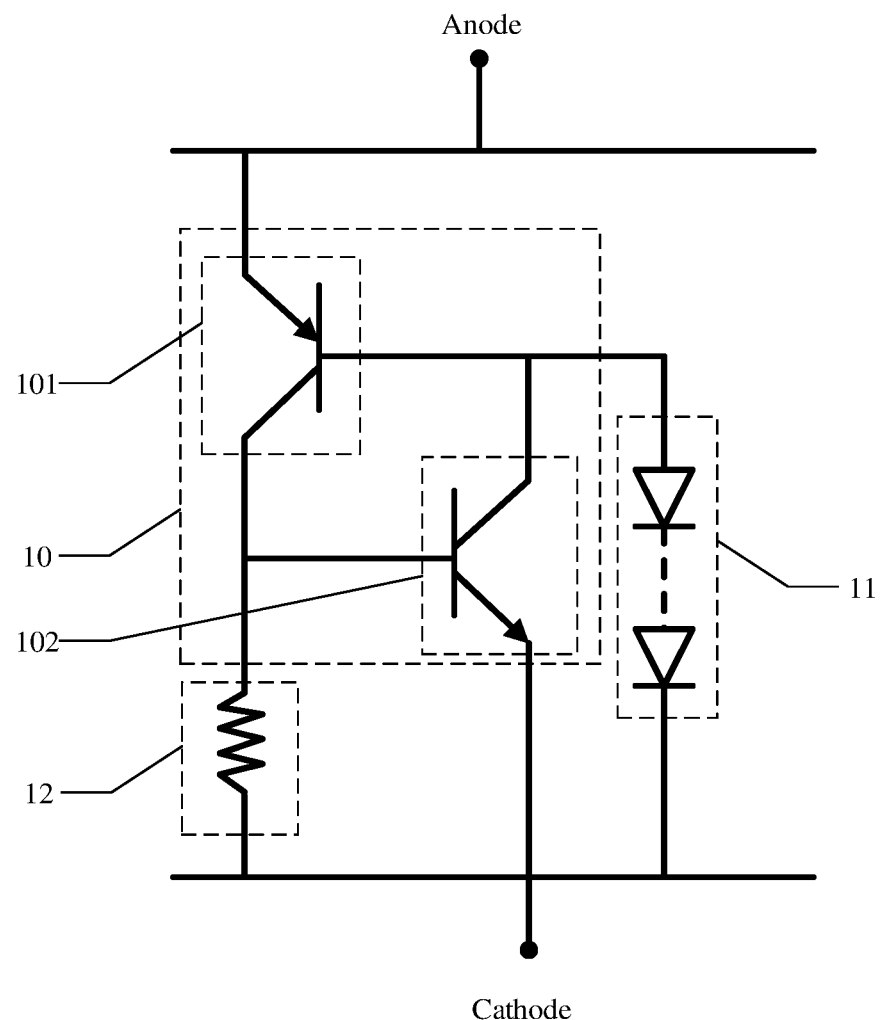
FIG. 1 is a circuit diagram of an electrostatic discharge protection device according to an embodiment of the disclosure.

In order to facilitate an understanding of the disclosure, the disclosure will be described more comprehensively below with reference to related accompanying drawings. Preferred embodiments of the disclosure are illustrated in the drawings. However, the disclosure may be embodied in many different forms, and is not limited to the embodiments described herein. Rather, these embodiments are provided so that the content of the disclosure will be more thorough and complete.

Unless otherwise defined, meanings of all technical and scientific terms used herein are the same as those general understood by those skilled in the art. The terms used in the description of the disclosure are merely to describe the specific embodiments, and are not intended to limit the disclosure.

Electrostatic discharge often occurs in integrated circuit products. This phenomenon may occur in all processes of semiconductor devices or circuits, such as manufacturing, packaging, testing, and storage. An internal circuit of a semiconductor device is electrically connected to the outside through a pin. When the semiconductor device is exposed to an electrostatic environment, an instantaneous high voltage may enter the semiconductor device, which will damage the semiconductor device. Therefore, an electrostatic discharge protection device will be arranged in the semiconductor device in the related technology. Existing electrostatic discharge protection devices have problems such as high trigger voltage, low maintenance voltage, and easy latch-up, and are not suitable for electrostatic discharge protection of semiconductor devices such as a dynamic random access memory (DRAM).

Figure 2:
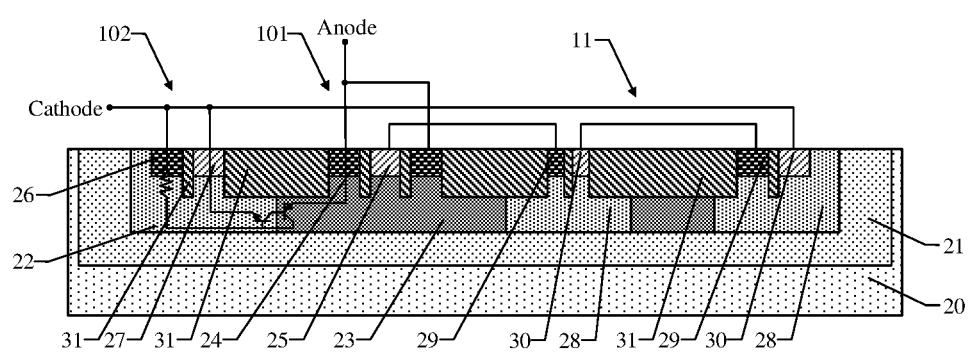
FIG. 2 is a schematic structural diagram of an electrostatic discharge protection device according to an embodiment of the disclosure.

Therefore, the disclosure provides an electrostatic discharge protection device, as shown in FIG. 1 and FIG. 2, including: a substrate 20, a darlington structure 10 formed in the substrate 20, and a diode string 11 formed in the substrate 20 and including a plurality of diodes connected in series. A first end of the darlington structure 10 is connected to a first voltage, and a second end of the darlington structure 10 is connected to a second voltage. An anode of the diode string 11 is connected to a third end of the darlington structure 10. A cathode of the diode string 11 is connected to the second voltage.

With the above technical solution, when the electrostatic discharge protection device is in an electrostatic environment, an instantaneous high voltage that enters the electrostatic discharge protection device will trigger the darlington structure 10 in the electrostatic discharge protection device to be turned on, thereby discharging an electrostatic current. The diode string 11 is connected between the third end of the darlington structure 10 and the second voltage, so that a trigger voltage of the darlington structure 10 is related to a threshold voltage of the diode string 11. Therefore, the trigger voltage for discharging the electrostatic current for the electrostatic discharge protection device may be adjusted by adjusting the number of diodes in the diode string 11, such that the trigger voltage for discharging the electrostatic current for the electrostatic discharge protection device may be adapted to the semiconductor device. The trigger voltage is low and adjustable, and areas of both the darlington structure 10 and the diode string 11 are relatively small.

In an alternative embodiment, a material of the substrate 20 may be silicon, germanium, GaAs (gallium arsenide), InP (indium phosphide) or GaN (gallium nitride), etc. That is, the substrate 20 may be a silicon substrate, a germanium substrate, a GaAs substrate, an InP substrate or a GaN substrate, etc. In the embodiment, the substrate 20 may be a silicon substrate.

In an alternative embodiment, a functional device, such as but not limited to a metal oxide semiconductor (MOS) transistor, may be formed in the substrate 20.

In an alternative embodiment, the darlington structure 10 includes a first transistor 101 and a second transistor 102. The first transistor 101 is a PNP transistor, and the second transistor 102 is an NPN transistor. An emitter of the first transistor 101 is the first end of the darlington structure 10. An emitter of the second transistor 102 is the second end of the darlington structure 10. A collector of the second transistor 102 is the third end of the darlington structure 10. A base of the second transistor 102 is a fourth end of the darlington structure 10. A collector of the first transistor 101 is connected to the base of the second transistor 102. A base of the first transistor 101 is connected to the collector of the second transistor 102.

When the electrostatic current enters the electrostatic discharge protection device, the diode string 11 connected in series between the third end of the darlington structure 10 and the second voltage is first turned on. The third end of the darlington structure 10 is the collector of the second transistor 102. The diode string 11 is turned on, resulting in a voltage drop between the collector and the emitter of the second transistor 102, so that the darlington structure 10 formed by the first transistor 101 and the second transistor 102 is turned on to discharge the electrostatic current.

In an alternative embodiment, the first transistor 101 is a PNP transistor, and the second transistor 102 is an NPN transistor. The first voltage is an anode voltage, and the second voltage is a cathode voltage. The emitter of the first transistor 101 is electrically connected to the anode voltage. The collector of the first transistor 101 is electrically connected to the cathode voltage. The base of the first transistor 101 is electrically connected to the collector of the second transistor 102. The emitter of the second transistor 102 is electrically connected to the cathode voltage. The base of the second transistor 102 is electrically connected to the collector of the first transistor 101. At this time, a connection node between the base of the first transistor 101 and the collector of the second transistor 102 is electrically connected to the anode of the diode string 11. Therefore, the trigger voltage of the darlington structure 10 formed by the first transistor 101 and the second transistor 102 is in positive correlation with the number of the diodes in the diode string 11. When the number of diodes in the diode string 11 is larger, the trigger voltage of the darlington structure 10 is higher. When the number of diodes in the diode string 11 is smaller, the trigger voltage of the darlington structure 10 is lower. Therefore, the trigger voltage of the darlington structure 10 may be controlled by controlling the number of the diodes connected in series in the diode string 11.

In an alternative embodiment, a deep well region is formed in the substrate 20. Specifically, the deep well region may be a deep N-well 21, and the darlington structure 10 and the diode string 11 are both arranged in the deep N-well 21. The deep N-well 21 isolates the darlington structure 10 and the diode string 11 from other internal circuits of the semiconductor device, which may reduce the mutual influence between the electrostatic discharge protection device and the internal circuits of the semiconductor device.

Specifically, an ion implantation process may be used to implant N-type ions into the substrate 20 to form the deep N-well 21.

In an alternative embodiment, the darlington structure 10 includes a first P-well 22 and a first N-well 23, and the first P-well 22 and the first N-well 23 are arranged adjacently. Both the bottom of the first P-well 22 and the bottom of the first N-well 23 are higher than the bottom of the deep N-well 21. A first P-type doped region 24 and a first N-type doped region 25 are provided in the first N-well 23. A second P-type doped region 26 and a second N-type doped region 27 are provided in the first P-well 22. The first P-type doped region 24, the first N-well 23, and the first P-well 22 constitute the first transistor 101. The first N-well 23, the first P-well 22, and the second N-type doped region 27 constitute the second transistor 102. The first P-well 22 may be formed by performing P-type ion implantation inversion on a partial region of the deep N-well 21. The first N-well 23 may be formed by continuing to perform N-type ion implantation on a partial region of the deep N-well 21. The first P-type doped region 24 in the first N-well 23 may be formed by performing P-type ion implantation inversion on a partial region of the first N-well 23. The first N-type doped region 25 in the first N-well 23 may be formed by continuing to perform N-type ion implantation on a partial region of the first N-well 23. The second P-type doped region 26 in the first P-well 22 is formed by continuing to perform P-type ion implantation on a partial region of the first P-well 22. The second N-type doped region 27 may be formed by performing N ion implantation inversion on the first P-well 22.

In an alternative embodiment, shallow trench isolation structures 31 are provided between the first P-type doped region 24 and the first N-type doped region 25, between the first P-type doped region 24 and the second N-type doped region 27, and between the second N-type doped region 27 and the second P-type doped region 26. After trenches are formed between the first P-type doped region 24 and the first N-type doped region 25, between the first P-type doped region 24 and the second N-type doped region 27, and between the second N-type doped region 27 and the second P-type doped region 26, insulation layers (for example, silicon oxide layers or silicon nitride layers) are deposited in the trenches, so that the shallow trench isolation structures 31 may be formed between the first P-type doped region 24 and the first N-type doped region 25, between the first P-type doped region 24 and the second N-type doped region 27, and between the second N-type doped region 27 and the second P-type doped region 26. Since the first P-well 22 is adjacent to the first N-well 23, the first P-type doped region 24 and the second N-type doped region 27 also need to be isolated by a shallow trench isolation structure 31, and the shallow trench isolation structure 31 between them spans over the first P-well 22 and a second P-well 28. Tops of the shallow trench isolation structures 31 are not lower than tops of the first P-type doped region 24, the first N-type doped region 25, the second P-type doped region 26 and the second N-type doped region 27, and bottoms of the shallow trench isolation structures 31 are lower than bottoms of the first P-type doped region 24, the first N-type doped region 25, the second P-type doped region 26 and the second N-type doped region 27 and are higher than bottoms of the first P-well 22 and the first N-well 23.

Figure 3:
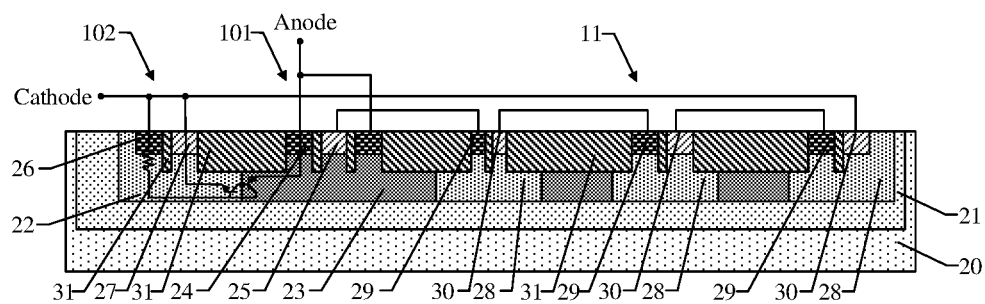
FIG. 3 is a schematic structural diagram of an electrostatic discharge protection device according to another embodiment of the disclosure.

In an alternative embodiment, the diode string 11 includes a plurality of second P-wells 28. Each of the plurality of second P-wells 28 corresponds to a respective one of the plurality of series-connected diodes. That is, one diode corresponds to one second P-well 28. The second P-well 28 is obtained by performing P-type ion implantation inversion on a partial region of the deep N-well 21. Therefore, the plurality of second P-wells 28 are separated by a plurality of N-wells. The second P-well 28 includes a third P-type doped region 29 and a third N-type doped region 30. The third P-type doped region 29 is an anode of the corresponding diode, and the third N-type doped region 30 is a cathode of the diode. A shallow trench isolation structure is also provided between the third P-type doped region 29 and the third N-type doped region 30. Each second P-well 28 includes one third P-type doped region 29 and one third N-type doped region 30. Therefore, as shown in FIG. 3, when the number of diodes in the diode string 11 needs to be increased, a second P-well 28 may be continued to be formed in the N-well, and a third P-type doped region 29 and a third N-type doped region 30 are formed in the second P-well 28. The second P-well 28 is connected to other diodes in the diode string 11, thus increasing the number of diodes in the diode string 11.

The first P-type doped region 24 in the first N-well 23 is connected to the first voltage, i.e., the anode voltage, after being led out via a lead. The first N-type doped region 25 in the first N-well 23 is electrically connected to the third P-type doped region 29 in one of the second P-wells 28 through a lead, and the third N-type doped region 30 in this second P-well 28 is electrically connected to the third P-type doped region 29 in a next second P-well 28. The remaining diodes are connected in series in sequence till the third N-type doped region 30 in the last second P-well 28 is electrically connected to the second voltage, i.e., the cathode voltage, after being led out through a lead. The second P-type doped region 26 and the second N-type doped region 27 in the first P-well 22 are both led out through leads and are electrically connected to the second voltage together with the third N-type doped region in the last second P-well 28.

In an alternative embodiment, continuing to refer to FIG. 1 to FIG. 3, the electrostatic discharge protection device further includes a parasitic resistor 12. One end of the parasitic resistor 12 is electrically connected to the fourth end of the darlington structure 10, and the other end is electrically connected to the second voltage. The parasitic resistor 12 is formed between the first P-well 22 and the second P-type doped region 26.

The working principle of the electrostatic discharge protection device in the disclosure is as follows. When there is a positive electrostatic pulse at the anode, the first transistor 101 is turned on, and a current is generated from the emitter to the base of the first transistor 101. As a voltage of the positive electrostatic pulse at the anode continuously increases, after a voltage difference between two ends of the diode string 11 is greater than a total threshold voltage of the diode string 11, the diode string 11 is turned on, and a relatively large voltage difference is generated between the collector and the emitter of the second transistor 102. After the voltage difference between the collector and the emitter of the second transistor 102 is greater than a saturation turn-on voltage of the second transistor 102, the second transistor 102 is turned on. The darlington structure 10 composed of the first transistor 101 and the second transistor 102 is turned on to discharge the electrostatic current. In addition, the darlington structure composed of the first transistor 101 and the second transistor 102 has an amplification function, and the electrostatic discharge capacity is much greater than the electrostatic discharge capacity of the diode string 11 and may be several times or more of the electrostatic discharge capacity of the diode string 11. Therefore, the electrostatic discharge protection device in the disclosure has higher electrostatic discharge protection capacity.

By means of the above technical solution, when a semiconductor device is in an electrostatic environment, an instantaneous high voltage that enters the semiconductor device will trigger the darlington structure 10 in the electrostatic discharge protection device to be turned on, thereby discharging an electrostatic current. The diode string 11 is connected between the third end of the darlington structure 10 and the second voltage, so that a trigger voltage of the darlington structure 10 is related to a threshold voltage of the diode string 11. Therefore, the trigger voltage for discharging the electrostatic current for the electrostatic discharge protection device may be adapted to the semiconductor device by adjusting the number of diodes in the diode string 11. The trigger voltage is low and adjustable, and areas of both the darlington structure 10 and the diode string 11 are relatively small, so that the electrostatic discharge protection device has relatively high electrostatic discharge protection capacity while having small area.

The technical features of the embodiments described above may be arbitrarily combined. In order to make the description concise, all possible combinations of various technical features in the above embodiments are not completely described. However, the combinations of these technical features should be considered within the scope described in the present specification as long as there is no contradiction in them.

The above-mentioned embodiments only represent several implementations of the disclosure, and their descriptions are more specific and detailed, but they cannot be understood as limiting the scope of the disclosure. It should be noted that those of ordinary skill in the art may further make various variations and improvements without departing from the concept of the disclosure, and these variations and improvements all fall within the scope of protection of the present disclosure. Therefore, the protection scope of the disclosure shall be subject to the appended claims.

The invention claimed is:

1. An electrostatic discharge protection device, comprising:
    a darlington structure formed in a substrate, a first end of the darlington structure being connected to a first voltage, and a second end of the darlington structure being connected to a second voltage; and
    a diode string formed in the substrate and comprising a plurality of diodes connected in series;
    wherein an anode of the diode string is connected to a third end of the darlington structure, and a cathode of the diode string is connected to the second voltage;
    wherein the darlington structure comprises a first transistor and a second transistor; the first transistor is a PNP transistor, and the second transistor is an NPN transistor; an emitter of the first transistor is the first end of the darlington structure; an emitter of the second transistor is the second end of the darlington structure; a collector of the second transistor is the third end of the darlington structure; a base of the second transistor is a fourth end of the darlington structure; a collector of the first transistor is connected to the base of the second transistor; and a base of the first transistor is connected to the collector of the second transistor;
    wherein the darlington structure further comprises a first P-well and a first N-well which are adjacently disposed;
    wherein the diode string comprises a plurality of second P-wells, and each of the plurality of second P-wells corresponds to a respective one of the plurality of diodes connected in series; and
    wherein each of the plurality of second P-wells comprises a third P-type doped region and a third N-type doped region; the third P-type doped region is an anode of a corresponding diode of the plurality of diodes connected in series, and the third N-type doped region is a cathode of the corresponding diode; and a shallow trench isolation structure is provided between the third P-type doped region and the third N-type doped region.

2. The electrostatic discharge protection device of claim 1, further comprising:
a deep N-well arranged in the substrate, wherein both the darlington structure and the diode string are arranged in the deep N-well.

3. The electrostatic discharge protection device of claim 1, wherein
a first P-type doped region and a first N-type doped region are arranged in the first N-well;
a second P-type doped region and a second N-type doped region are arranged in the first P-well;
the first P-type doped region, the first N-well, and the first P-well constitute the first transistor; and
the first N-well, the first P-well, and the second N-type doped region constitute the second transistor.

4. The electrostatic discharge protection device of claim 3, wherein
shallow trench isolation structures are provided between the first P-type doped region and the first N-type doped region, between the first P-type doped region and the second N-type doped region, and between the second N-type doped region and the second P-type doped region.

5. The electrostatic discharge protection device of claim 1, wherein
the plurality of second P-wells are separated by a plurality of N-wells.

6. The electrostatic discharge protection device of claim 1, further comprising:
a parasitic resistor, wherein one end of the parasitic resistor is electrically connected to the fourth end of the darlington structure, and a second end is electrically connected to the second voltage.

7. The electrostatic discharge protection device of claim 1, wherein
a trigger voltage of the darlington structure is in positive correlation with a number of the diodes in the diode string.

* * * * *